US012651620B2

(12) United States Patent
Khwa et al.

(10) Patent No.: US 12,651,620 B2
(45) Date of Patent: Jun. 9, 2026

(54) METHOD OF STORING DATA IN MEMORIES

(71) Applicant: TAIWAN SEMICONDUCTOR MANUFACTURING COMPANY, LTD., Hsinchu (TW)

(72) Inventors: Win-San Khwa, Hsinchu (TW); Jui-Jen Wu, Hsinchu (TW); Jen-Chieh Liu, Hsinchu (TW); Meng-Fan Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 73 days.

(21) Appl. No.: 18/739,724

(22) Filed: Jun. 11, 2024

(65) Prior Publication Data

US 2024/0331748 A1 Oct. 3, 2024

Related U.S. Application Data

(62) Division of application No. 17/747,318, filed on May 18, 2022, now Pat. No. 12,009,051.

(51) Int. Cl.
*G11C 7/10* (2006.01)
*G11C 7/06* (2006.01)

(52) U.S. Cl.
CPC .............. *G11C 7/1096* (2013.01); *G11C 7/06* (2013.01); *G11C 7/1069* (2013.01)

(58) Field of Classification Search
CPC .................................................. G11C 7/1096
See application file for complete search history.

(56) References Cited

U.S. PATENT DOCUMENTS

| | | | |
|---|---|---|---|
| 2014/0208014 A1 | 7/2014 | Voutilainen | |
| 2016/0357632 A1 | 12/2016 | d'Abreu | |
| 2021/0306006 A1* | 9/2021 | Song ..................... | G06N 3/063 |
| 2023/0010522 A1 | 1/2023 | Khwa | |
| 2023/0103548 A1 | 4/2023 | Knothe Tate | |

FOREIGN PATENT DOCUMENTS

| | | |
|---|---|---|
| TW | 201212041 | 3/2012 |
| TW | I742955 | 10/2021 |

OTHER PUBLICATIONS

W. Zhao, A. Li, Y. Wang and Y. Ha Analysis and design of energy-efficient data-dependent SRAM 2017 IEEE 12th International Conference on ASIC (ASICON) IEEE 2017 pp. 912-915.

* cited by examiner

*Primary Examiner* — Hoai V Ho
(74) *Attorney, Agent, or Firm* — Hauptman Ham, LLP

(57) ABSTRACT

A method of storing an input data of a data set into a memory storage having bit cells. The method includes determining a bit value of a characterization bit in the input data. The method also includes writing each of remaining bits in the input data into one of the bit cells either as the first state or as the second state conditioning upon whether the bit value of the characterization bit is a first value or a second value. Reading the bit cell with the first state consumes less energy than reading the bit cell with the second state or the bit cell with the first state has less retention errors than the bit cell with the second state.

20 Claims, 17 Drawing Sheets

700

$$Cm \begin{bmatrix} 1 & 0 & 0 \\ 1 & 0 & 1 \\ 1 & 1 & 0 \\ 1 & 1 & 1 \\ 0 & 0 & 0 \\ 0 & 0 & 1 \\ 0 & 1 & 0 \\ 0 & 1 & 1 \end{bmatrix}$$

FIG. 10A $$\begin{bmatrix} M[2] \\ M[1] \\ M[0] \end{bmatrix} = \begin{bmatrix} 1 & 1 & 1 & 1 & 0 & 0 & 0 & 0 \\ 0 & 0 & 1 & 1 & 0 & 0 & 1 & 1 \\ 0 & 1 & 0 & 1 & 0 & 1 & 0 & 1 \end{bmatrix} X$$

$$E(X) = \begin{bmatrix} p(n=-4) \\ p(n=-3) \\ p(n=-2) \\ p(n=-1) \\ p(n=0) \\ p(n=1) \\ p(n=2) \\ p(n=3) \end{bmatrix}$$

FIG. 10D $$\begin{bmatrix} b[2] \\ b[1] \\ b[0] \end{bmatrix} = \begin{bmatrix} 1 & 1 & 1 & 1 & 0 & 0 & 0 & 0 \\ 0 & 0 & 1 & 1 & 0 & 0 & 1 & 1 \\ 0 & 1 & 0 & 1 & 0 & 1 & 0 & 1 \end{bmatrix} \begin{bmatrix} p(n=-4) \\ p(n=-3) \\ p(n=-2) \\ p(n=-1) \\ p(n=0) \\ p(n=1) \\ p(n=2) \\ p(n=3) \end{bmatrix}$$

FIG. 11A $$\begin{bmatrix} b[2] \\ b[1] \\ b[0] \end{bmatrix} = \begin{bmatrix} p(n=-4)+p(n=-3)+p(n=-2)+p(n=-1) \\ p(n=-2)+p(n=-1)+p(n=2)+p(n=3) \\ p(n=-3)+p(n=-1)+p(n=1)+p(n=3) \end{bmatrix}$$

FIG. 11B $$p \text{ (binary one)} = (1/3) [1,1,1] \begin{bmatrix} b[2] \\ b[1] \\ b[0] \end{bmatrix} = (1/3) I_3 \cdot C \cdot P_a(n)$$

FIG. 12A $$I_3 = [1,1,1]$$

FIG. 12B $$Ps(n) = \begin{bmatrix} p(n=-4) \\ p(n=-3) \\ p(n=-2) \\ p(n=-1) \\ p(n=0) \\ p(n=1) \\ p(n=2) \\ p(n=3) \end{bmatrix} \quad [\, p(n=-4), p(n=-3), \dots p(n=3)]^T$$

FIG. 12C $$p \text{ (binary one)} = (1/N)\, I_N \cdot C^T \cdot P_M(u)$$

FIG. 13A $$\overbrace{\phantom{xxxxxxxx}}^{N}$$

$$I_N = [1,1\ldots,1]$$

FIG. 13B $$\overbrace{\phantom{xxxxxxxxxxxxxxxxxxxxxx}}^{M}$$

$$P_M(u) = [\, P(u=u_1),P(u=u_2),\ldots,P(u=u_M)\,]^T$$

FIG. 13C $$
\begin{bmatrix} B_{c1}[2] \\ B_{c1}[1] \\ B_{c1}[0] \end{bmatrix} = K_1 \begin{bmatrix} 1 & 1 & 1 & 1 & 0 & 0 & 0 & 0 \\ 0 & 0 & 1 & 1 & 0 & 0 & 1 & 1 \\ 0 & 1 & 0 & 1 & 0 & 1 & 0 & 1 \end{bmatrix} \begin{bmatrix} p(n=-4) \\ p(n=-3) \\ p(n=-2) \\ p(n=-1) \\ 0 \\ 0 \\ 0 \\ 0 \end{bmatrix}
$$

FIG. 14A $$
\begin{bmatrix} B_{c1}[2] \\ B_{c1}[1] \\ B_{c1}[0] \end{bmatrix} = K_1 \begin{bmatrix} p(n=-4)+p(n=-3)+p(n=-2)+p(n=-1) \\ p(n=-2)+p(n=-1) \\ p(n=-3)+p(n=-1) \end{bmatrix}
$$

FIG. 14B $$
\begin{bmatrix} B_{c0}[2] \\ B_{c0}[1] \\ B_{c0}[0] \end{bmatrix} = K_0 \begin{bmatrix} 0 & 0 & 0 & 0 & 1 & 1 & 1 & 1 \\ 0 & 0 & 1 & 1 & 0 & 0 & 1 & 1 \\ 0 & 1 & 0 & 1 & 0 & 1 & 0 & 1 \end{bmatrix} \begin{bmatrix} 0 \\ 0 \\ 0 \\ 0 \\ p(n=0) \\ p(n=1) \\ p(n=2) \\ p(n=3) \end{bmatrix}
$$

FIG. 15A $$
\begin{bmatrix} B_{c0}[2] \\ B_{c0}[1] \\ B_{c0}[0] \end{bmatrix} = K_0 \begin{bmatrix} p(n=0)+p(n=1)+p(n=2)+p(n=3) \\ p(n=2)+p(n=3) \\ p(n=1)+p(n=3) \end{bmatrix}
$$

FIG. 15B

METHOD OF STORING DATA IN MEMORIES

PRIORITY CLAIM

The present application is a divisional of U.S. application Ser. No. 17/747,318, filed May 18, 2022, which is incorporated herein by reference in its entirety.

BACKGROUND

In some non-volatile memory devices, each bit of information is stored in a memory element that has two states. Examples of non-volatile memory devices include PCRAM (Phase Change Random Access Memory) devices, RRAM (resistive Random Access Memory) devices, and MRAM (Magnetoresistive Random Access Memory) devices. The two states of the memory element may have different retention failure rates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10A is an equation of a coding matrix corresponding to a coding table, in accordance with some embodiments.

FIG. 10B is an equation of mapping a column vector representing integers to the column vector representing the bits in coded integers, in accordance with some embodiments.

FIG. 10D is the expected value expressed in matrix form, in accordance with some embodiments.

FIG. 11A is an equation for calculating the probability of finding the binary one in the bits of the coded data, in accordance with some embodiments.

FIG. 11B is an equation for calculating the probability of finding the binary one in the bits of the coded data, after finishing the matrix multiplication in FIG. 6A, in accordance with some embodiments.

FIG. 12A is an equation for calculating the probability p (binary one), in accordance with some embodiments.

FIG. 12B-12C are the definitions of the matrixes in FIG. 12A, in accordance with some embodiments.

FIG. 13A is an equation for calculating the probability p (binary one), in accordance with some embodiments.

FIG. 13B-13C are the definitions of the matrixes in FIG. 8A, in accordance with some embodiments.

FIGS. 14A-14B are equations for calculating the conditional probabilities of finding the binary one when the MSB has the binary one, in accordance with some embodiments.

FIGS. 15A-15B are equations for calculating the probabilities of finding the binary one when the MSB has the binary zero, in accordance with some embodiments.

DETAILED DESCRIPTION

Figure 1A:
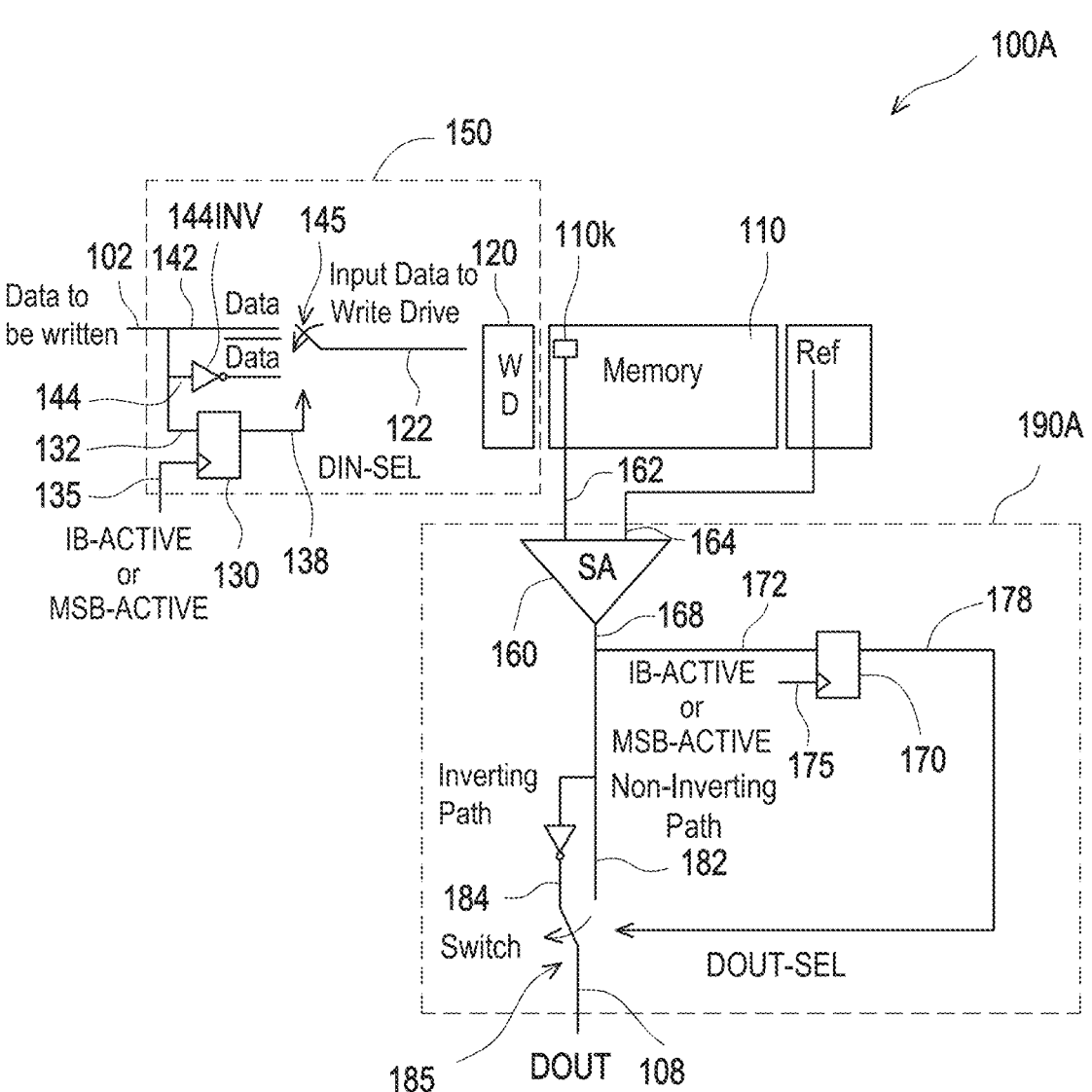
FIGS. 1A-1B are schematic diagrams of integrated circuits, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, when data is stored into a memory storage, how to store each bit of the data in a bit cell of the memory storage influences the data reliability, because the bit cell has a preferred state and a non-preferred state. The preferred state is less susceptible to retention errors, as compared with the non-preferred state. In some embodiments, each of the binary one and the binary zero in the data is identified as either a majority bit value or a minority bit value. A probability of finding a majority bit value in the data is larger than a probability of finding a minority bit value in the data. If a bit of the data has the majority bit value, then the bit of the data is stored into the bit cell with the preferred state; on the other hand, if a bit of the data has the minority bit value, then the bit of the data is stored into the bit cell with the non-preferred state. In some embodiments, a bit-state indicator is used to indicate whether the binary one or the binary zero is the majority bit value, or conversely used to indicate whether the binary one or the binary zero is the minority bit value. In some embodiments, an integrated circuit relies upon the bit-state indicator to write a data into the memory storage and to read out the stored data from the memory storage.

In some embodiments, the bit cells in the memory storage are based on Phase Change Random Access Memory (PCRAM) devices. In some PCRAM devices, the change of the conductivity of a phase-changing material is used to store one bit of information. For example, in some embodiments, the conductivity of a phase-changing material depends upon whether a phase-changing material is in an amorphous phase or a crystalline phase, and the different conductivity values of the phase-changing material allows the storage of one bit of information. In some embodiments, the higher-resistance state corresponds to the amorphous phase, while the lower-resistance state corresponds to the crystalline phase. Because the drift of resistance value depends on the amorphous volume, the higher-resistance state is more susceptible to retention errors. When the bit cells in the memory storage are based on PCRAM devices, the lower-resistance state of a bit cell is the preferred state, and the higher-resistance state of a bit cell is the non-preferred state. In some embodiments, a bit cell in a PCRAM device has a first state and a second state, when the bit cell with the first state has less retention errors than the bit cell with the second state, the first state is the preferred state and the second state is the non-preferred state. Alternatively, when the bit cell with the second state has less retention errors than the bit cell with the first state, the second state is the preferred state and the first state is the non-preferred state.

In some embodiments, the bit cells in the memory storage are based on filament type Resistive Random Access Memory (RRAM) devices. In some filament type RRAM devices, the change of the resistance of a specially formulated dielectric material is used to store one bit of information. For example, in some embodiments, the forming of filaments changes the conductivity of the dielectric material in a capacitor, and the controlled formation and destruction of filaments allows the storage of one bit of information. In some embodiments, data retention failure is mainly caused by the rupture of the conducting filaments; as such, the lower-resistance state is more susceptible to retention errors, as compared with the higher-resistance state. When the bit cells in the memory storage are based on filament type RRAM devices, the higher-resistance state of a bit cell is the preferred state, and the lower-resistance state of a bit cell is the non-preferred state. In some embodiments, a bit cell in a RRAM device has a first state and a second state, when the bit cell with the first state has less retention errors than the bit cell with the second state, the first state is the preferred state and the second state is the non-preferred state. Alternatively, when the bit cell with the second state has less retention errors than the bit cell with the first state, the second state is the preferred state and the first state is the non-preferred state.

In some embodiments, the bit cells in the memory storage are based on Magnetoresistive Random Access Memory (MRAM) devices. In some MRAM devices, the relative orientation of the magnetization in the two plates is used to store one bit of information. For example, in some embodiments, if the two plates have the same magnetization alignment, the resultant low resistance state between the two plates is designated as a first storage state, and if the alignment is antiparallel, the resultant high resistance state between the two plates is designated as a second storage state. In some embodiments, the relative orientation of the magnetization is programmed based on the direction of the program current. Because the read current creates some disturbance on the magnetization in the two plates, the magnetization state that is programmed with a first program current in the same direction of the read current generally is subject to a smaller magnetization disturbance than the magnetization state that is programmed with a second program current in the opposite direction of the read current; consequently, the magnetization state that is programmed with the second program current is more susceptible to retention errors. In some embodiments, when the bit cells in the memory storage are based on MRAM devices, the magnetization state programmed with a program current in the same direction of the read current is the preferred state, and the magnetization state programmed with a program current in the opposite direction of the read current is the non-preferred state.

When a data having multiple bits is stored in the bit cells of the memory storage, the method of encoding the data for storage may influence the data reliability, if the two states for storing one bit of information in a bit cell have different retention errors. When the two states of a bit cell include a preferred state and a non-preferred state, if the number of binary one bits in the data is different from the number of binary zero bits in the data when the data is coded with multiple bits, the data reliability depends upon how to select which one of the two states for storing a binary one bit and which one of the two states for storing a binary zero bit. Specifically, if the number of binary one bits in the data is larger than the number of binary zero bits in the data, an implementation of using the preferred states to store the binary one bits and using the non-preferred states to store the binary zero bits generally has improved data reliability, as compared with an alternative implementation in which the preferred states are used to store the binary zero bits and the non-preferred states are used to store the binary one bits. In contrast, if the number of binary one bits in the data is smaller than the number of binary zero bits in the data, an implementation of using the preferred states to store the binary zero bits and using the non-preferred states to store the binary one bits generally has improved data reliability, as compared with an alternative implementation in which the preferred states are used to store the binary one bits and the non-preferred states are used to store the binary zero bits.

In some embodiments, when data is stored into a memory storage, how to store each bit of the data in a bit cell of the memory storage also influences the power consumption of a memory device, because the bit cell has a preferred state and a non-preferred state. As an example, a MRAM device stores the bit value of a bit cell either in a high resistive state (HRS) or in a low resistive state (LRS), and some energies are consumed when the voltages on the bit lines connecting to the bit cell get charged or discharged. The energy consumed for reading out the bit value of a bit cell in the LRS state is higher than the energy consumed for reading out the bit value of a bit cell in the HRS state. In the example of the MRAM device, the HRS state is the preferred state, and the LRS state is the non-preferred state. In some embodiments, a bit cell has a first state and a second state, when reading the bit cell with the first state consumes less energy than reading the bit cell with the second state, the first state is the preferred state and the second state is the non-preferred state. Alternatively, when reading the bit cell with the second state consumes less energy than reading the bit cell with the first state, the second state is the preferred state and the first state is the non-preferred state.

Figure 1B:
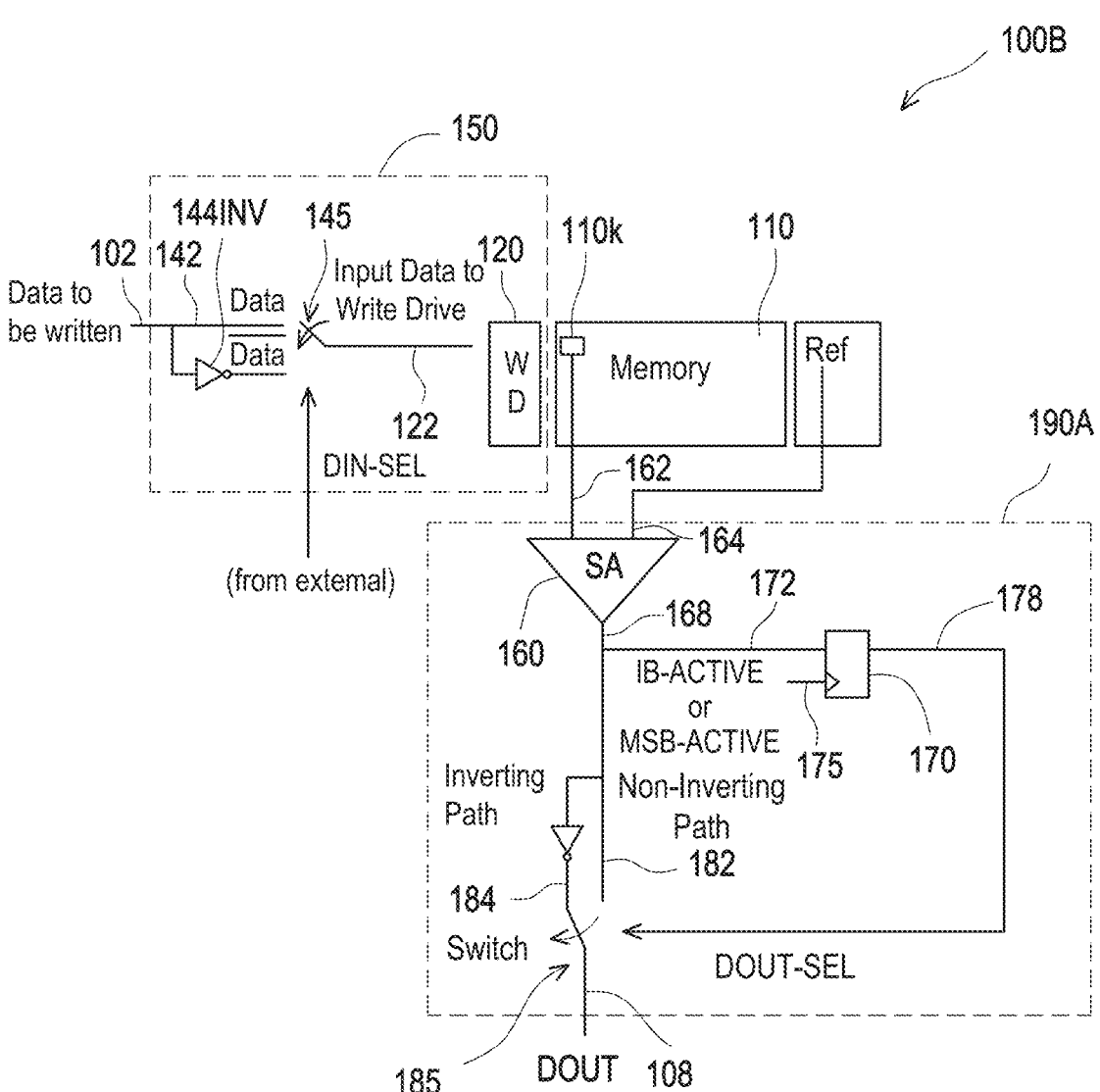

FIGS. 1A-1B are schematic diagrams of integrated circuits 100A-100B, in accordance with some embodiments.

Each of the integrated circuits 100A-100B includes a memory storage 110 having bit cells, a write circuit 150 connected with the memory storage 110, and a read circuit 190A connected with the memory storage 110. One of the bit cells, the bit cell 110$k$, is shown in the figure. Other bit cells are not explicitly shown in FIGS. 1A-1B. In some embodiments, the bit cells in the memory storage 110 are arranged in one or more one-dimensional arrays. In some embodiments, the bit cells in the memory storage 110 are arranged in one or more two-dimensional arrays. In FIGS. 1A-1B, a bit cell has a preferred state and a non-preferred state. Example storage devices for implementing the bit cells include PCRAM devices, RRAM devices, and MRAM devices.

In FIGS. 1A-1B, the write circuit 150 includes a write driver 120, a write path switch 145, a first write path 142, a second write path 144, and a write terminal 102. In FIG. 1A, the write circuit 150 further includes a bit-state indicator latch 130. The first write path 142 is coupled between the write terminal 102 and the write path switch 145. The second write path 144 having an inverter 144INV is coupled between the write terminal 102 and the write path switch 145. The write driver 120 has an input 122 that is connected to the write path switch 145.

In FIGS. 1A-1B, the read circuit 190A includes a sense amplifier 160, a read path switch 185, a first read path 182, a second read path 184, and a read terminal 108. The read circuit 190A in FIGS. 1A-1B further includes a bit-state indicator latch 170. The first read path 182 is coupled between the sense amplifier 160 and the read path switch 185. The second read path 184 having an inverter 184INV is coupled between the sense amplifier 160 and the read path switch 185. In FIGS. 1A-1B, the bit-state indicator latch 170 has an input 172 connected to the output 168 of the sense amplifier 160.

In FIGS. 1A-1B, the write driver 120 has the input 122 configured to receive an input data from the write terminal 102 through either the first write path 142 or the second write path 144. If the write path switch 145 is at a first connection state, the data at the write terminal 102 is transmitted to the input 122 of the write driver 120 as the input data through the first write path 142. If the write path switch 145 is at a second connection state, the data at the write terminal 102 is transmitted to the input 122 of the write driver 120 as the input data through the second write path 144. If the input data is received through the first write path 142, the input data at the input 122 of the write driver 120 is equal to the data at the write terminal 102. If the input data is received through the second write path 144, the input data at the input 122 of the write driver 120 is equal to a bitwise complement of the data at the write terminal 102. In some embodiments, the first write path 142 is implemented as an electric conductor connected between the input 122 of the write driver 120 and the write terminal 102, and the second write path 144 is implemented with the inverter 144INV operationally connected between the input 122 of the write driver 120 and the write terminal 102. Other implementations of the first write path 142 and the second write path 144 are within the contemplated scope of the present disclosure.

Whether the write path switch 145 is set at the first connection state or at the second connection state is determined by a bit-state indicator or a characterization bit in the input data. In some embodiments, the characterization bit in the input data is the MSB in the input data. In some embodiments, the bit-state indicator or the characterization bit is received from the write terminal 102 by the bit-state indicator latch 130. In some embodiments, as shown in FIG.

1A, the one bit indicator signal or the characterization bit at the input 132 of the bit-state indicator latch 130 is latched during a time interval as determined by an IB-ACTIVE signal received at the terminal 135 of the bit-state indicator latch 130. In some embodiments, as shown in FIG. 1A, the bit-state indicator latch 130 receives the MSB of an input data from the write terminal 102. The MSB signal at the input 132 of the bit-state indicator latch 130 is latched during a time interval as determined by an MSB_active signal received at the terminal 135 of the bit-state indicator latch 130.

In some embodiments, as shown in FIG. 1A, the latch output signal DIN-SEL at the output terminal 138 of the bit-state indicator latch 130 is used to control the write path switch 145. In some embodiments, as shown in FIG. 1B, the signal DIN_sel that is used to control the write path switch 145 is received from an external source which is not part of the write circuit 150. When the signal DIN_sel is not determined in the write circuit 150, area overhead associated with the sub-circuit for determining the signal DIN_sel is reduced. In some embodiments, more flexible algorithms for determining the signal DIN_sel are implemented with circuits external to the write circuit 150.

In some embodiments, the bit-state indicator is set based on a majority bit value in the data or based on a minority bit value in the data. If the number of binary one bits in the data at the write terminal 102 is larger than the number of binary zero bits in the data at the write terminal 102, then the binary one is the majority bit value and the binary zero is the minority bit value. Conversely, if the number of binary one bits in the data at the write terminal 102 is smaller than the number of binary zero bits in the data at the write terminal 102, then the binary zero is the majority bit value and the binary one is the minority bit value. In some embodiments, the bit-state indicator is set to a first value if the binary one is the majority bit value and the binary zero is the minority bit value, and the bit-state indicator is set to a second value different from the first value if the binary zero is the majority bit value and the binary one is the minority value. In some embodiments, the bit-state indicator is implemented as one indicator bit which is either the binary one or the binary zero. In a first example implementation, the indicator bit is set to the binary one if the binary one is the majority bit value, and the indicator bit is set to the binary zero if the binary zero is the majority bit value. In a second example implementation, the indicator bit is set to the binary zero if the binary one is the majority bit value, and the indicator bit is set to the binary one if the binary zero is the majority bit value.

Figure 2:
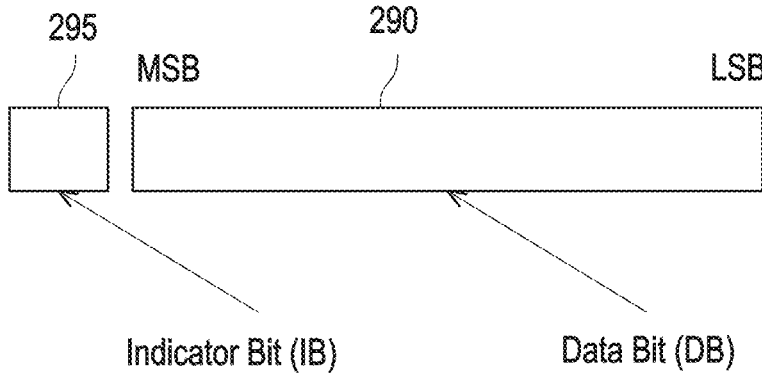
FIG. 2 is a schematic diagram of a data and an indicator bit, in accordance with some embodiments.

In some embodiments, the indicator bit associated with a data is stored in the memory storage 110 along with the data. FIG. 2 is a schematic diagram of a data 290 in the memory storage 110 and the indicator bit 295 associated with the data 290, in accordance with some embodiments. In FIG. 2, the individual bit of the data 290 is stored from the Most Significant Bit ("MSB") to the Least Significant Bit ("LSB"). The indicator bit 295 is stored in the memory storage 110 as a header before the MSB of the data 290. One of the bit cells in the memory storage 110 is used as an indicator storage for storing the indicator bit 295. When the indicator bit 295 and the data 290 are read out from the memory storage 110 as a bit stream, if the data 290 is read in the order from the MSB to the LSB, the indicator bit 295 arrives before the MSB of the data 290, while the LSB of the data 290 arrives last in the bit stream. In some alterative embodiments, the indicator bit 295 is stored in the memory storage 110 as a footer after the LSB of the data 290. When the indicator bit 295 and the data 290 are read out from the memory storage 110 as a bit stream, if the data 290 is read in the order from the MSN to the LSB, the MSB of the data 290 arrives first, while the indicator bit 295 arrives last after the LSB of the data 290. In some embodiments, the data 290 and the indicator bit 295 in the memory storage 110 are read out with a sense amplifier.

In FIGS. 1A-1B, the sense amplifier 160 is configured to detect one or more stored bits in the memory storage 110. A first input 162 of the sense amplifier 160 is connected to the bit cell 110k, and a second input 164 of the sense amplifier 160 is connected to a reference voltage REF. The sense amplifier 160 is configured to output a bit read value to the read terminal 108 through either the first read path 182 or the second read path 184 as determined by the connection state of a read path switch 185. If the read path switch 185 is at a first connection state, the bit read value at the read terminal 108 is received from the output 168 of the sense amplifier 160 through the first read path 182, and the bit read value through the first read path 182 has a same binary value as the stored bit. If the read path switch 185 is at a second connection state, the bit read value at the read terminal 108 is received from the output 168 of the sense amplifier 160 through the second read path 184, and the bit read value through the second read path 184 has a complement binary value as the stored bit. In some embodiments, the first read path 182 is implemented as an electric conductor connected between the output 168 of the sense amplifier 160 and the read terminal 108, and the second read path 184 is implemented with the inverter 184INV operationally connected between the output 168 of the sense amplifier 160 and the read terminal 108. Other implementations of the first read path 182 and the second read path 184 are within the contemplated scope of the present disclosure.

Whether the read path switch 185 is set at the first connection state or at the second connection state is determined by a bit-state indicator. In some embodiments, the bit-state indicator is represented by the indicator bit 295 in FIG. 2. When the indicator bit 295 and the data 290 are read out from the memory storage 110 as a bit stream by the sense amplifier 160, the indicator bit 295 at the output 168 of the sense amplifier 160 is received at the input 172 of the bit-state indicator latch 170. During a time interval as determined by an IB-ACTIVE signal (or an MSB-ACTIVE signal) received at the terminal 175 of the bit-state indicator latch 170, the bit value of the indicator bit 295 is latched into the bit-state indicator latch 170. The latch output signal DOUT-SEL at the output terminal 178 of the bit-state indicator latch 170 is used to control the read path switch 185.

Figure 3:
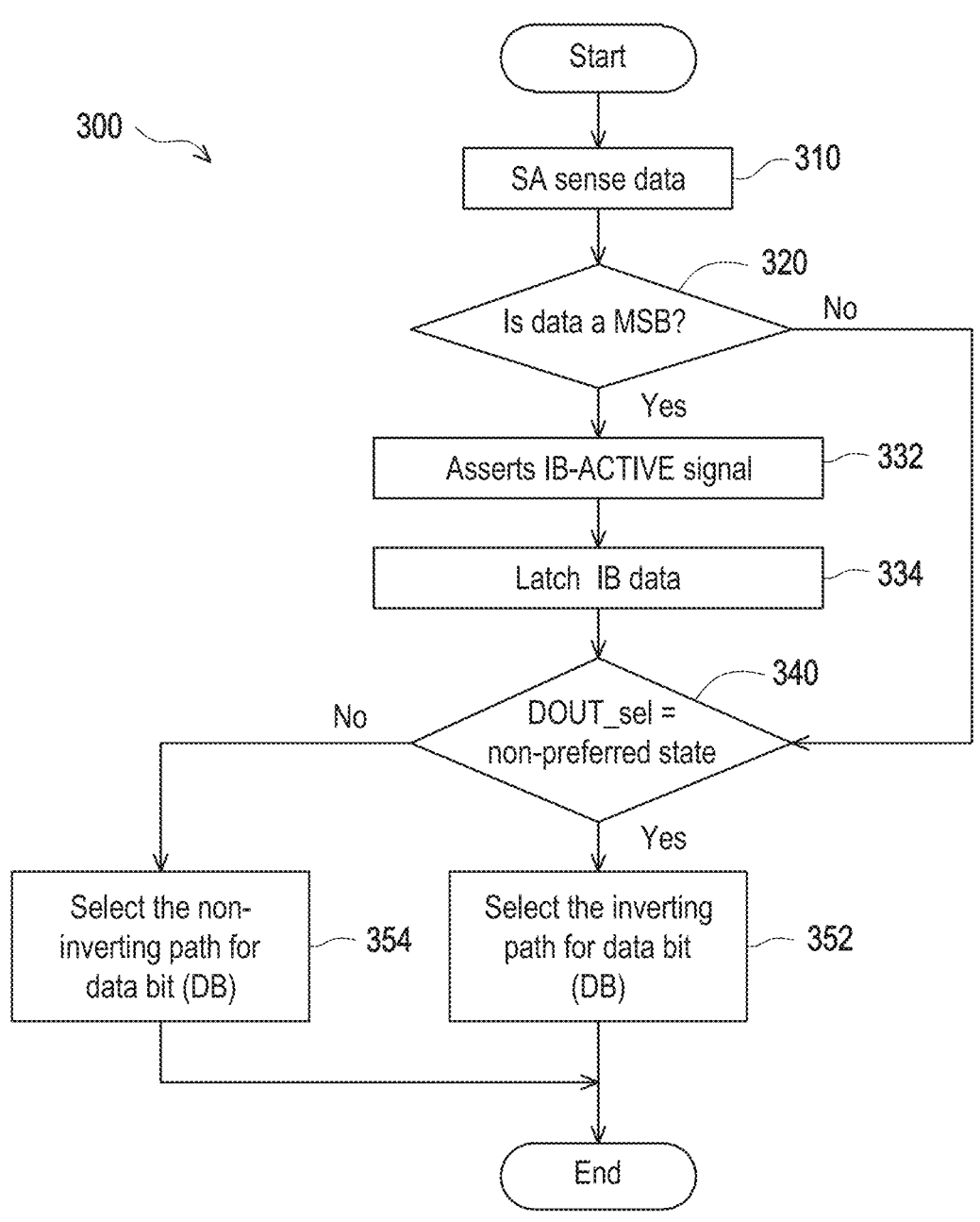
FIG. 3 and FIG. 4 are flowcharts of methods of reading the stored bits in the memory storage, in accordance with some embodiments.

In FIGS. 1A-1B, during the writing process when the original data at the write terminal 102 is written into the memory storage 110 as a stored data, the bit-state indicator is used to determine whether the stored data is equal to the original data or equal to a bitwise complement of the original data. During the read process when the stored data is readout from the memory storage 110 as an output data at the read terminal 108, the bit-state indicator is used to determine whether the output data is equal to the stored data or equal to a bitwise complement of the stored data. If the bit-state indicator during the writing process is the same as the bit-state indicator during the read process, the output data at the read terminal 108 is the same as the original data at the write terminal 102. On the other hand, if the bit-state indicator for the original data during the writing process and the bit-state indicator for the output data during the read process are not consistent, the output data can be erroneously changed from the original data. Consequently, the data reliability for the data stored with the integrated circuit 100 in FIGS. 1A-1B depends upon the reliability of the bit-state indicator. In some embodiments, the bit-state indicator is implemented as an indicator bit 295 stored in a bit cell which is less susceptible to retention errors, as compared with the bit cells for the data bits in the data 290. In some embodiments, the bit-state indicator associated with a data is stored in a separate memory storage which has better reliability than the memory storage 110 for storing the data bits of the data. In still some embodiments, the bit-state indicator is implemented with two indicator bits. A bit-state indicator implemented with two indicator bits generally is less susceptible to retention errors, as compared with a bit-state indicator implemented with only one indicator bit FIG. 3 is a flowchart of a method 300 of reading the stored bits in the memory storage 110 of FIGS. 1A-1B, in accordance with some embodiments. The sequence in which the operations of method 300 are depicted in FIG. 3 is for illustration only; the operations of method 300 are capable of being executed in sequences that differ from that depicted in FIG. 3. It is understood that additional operations may be performed before, during, and/or after the method 300 depicted in FIG. 3, and that other processes may only be briefly described herein.

In operation 310 of method 300, data is sensed with a sense amplifier. In the example embodiments of FIGS. 1A-1B, one or more stored bits in the memory storage 110 are sensed with the sense amplifier 160. In operation 320 of method 300, one or more bits in the data sensed from the memory storage 110 are determined based on addresses of the bit cells for storing the bits. If the one or more bits in the data are not one of the indicator bits, the process proceeds to operation 340. Conversely, if the one or more bits in the data include at least one indicator bit, the process proceeds to operation 332 and subsequently to operation 334.

In operation 332 of method 300, one or more IB-ACTIVE signals are asserted. In operation 334 of method 300, one or more indicator bits are latched. In the example embodiment of FIGS. 1A-1B, the IB-ACTIVE signal is applied to the terminal 175 of the bit-state indicator latch 170, and the value of the indicator bit 295 is latched into the bit-state indicator latch 170. After operation 334, the process proceeds to operation 340.

In operation 340 of method 300, the signal DOUT-SEL related to the latch output signal is applied to the read path switch. In some embodiments, binary one is used to indicate an implementation which stores the majority bit value to the non-preferred state with the non-inverting path. If the signal DOUT-SEL is equal to binary one, the inverting path for the data bits is selected in operation 352, and conversely, if the signal DOUT-SEL is not equal to binary one, the non-inverting path for the data bits is selected in operation 354. In some alternative embodiments, binary zero is used to indicate an implementation which stores the majority bit value to the non-preferred state with the non-inverting path. If the signal DOUT-SEL is equal to binary zero, the inverting path for the data bits is selected in operation 352, and conversely, if the signal DOUT-SEL is not equal to binary zero, the non-inverting path for the data bits is selected in operation 354. In the example embodiments of FIGS. 1A-1B, the signal DOUT-SEL is applied to the read path switch 185 to select either the first read path 182 or the second read path 184 as the signal connection between the output 168 of the sense amplifier 160 and the read terminal 108.

Figure 4:
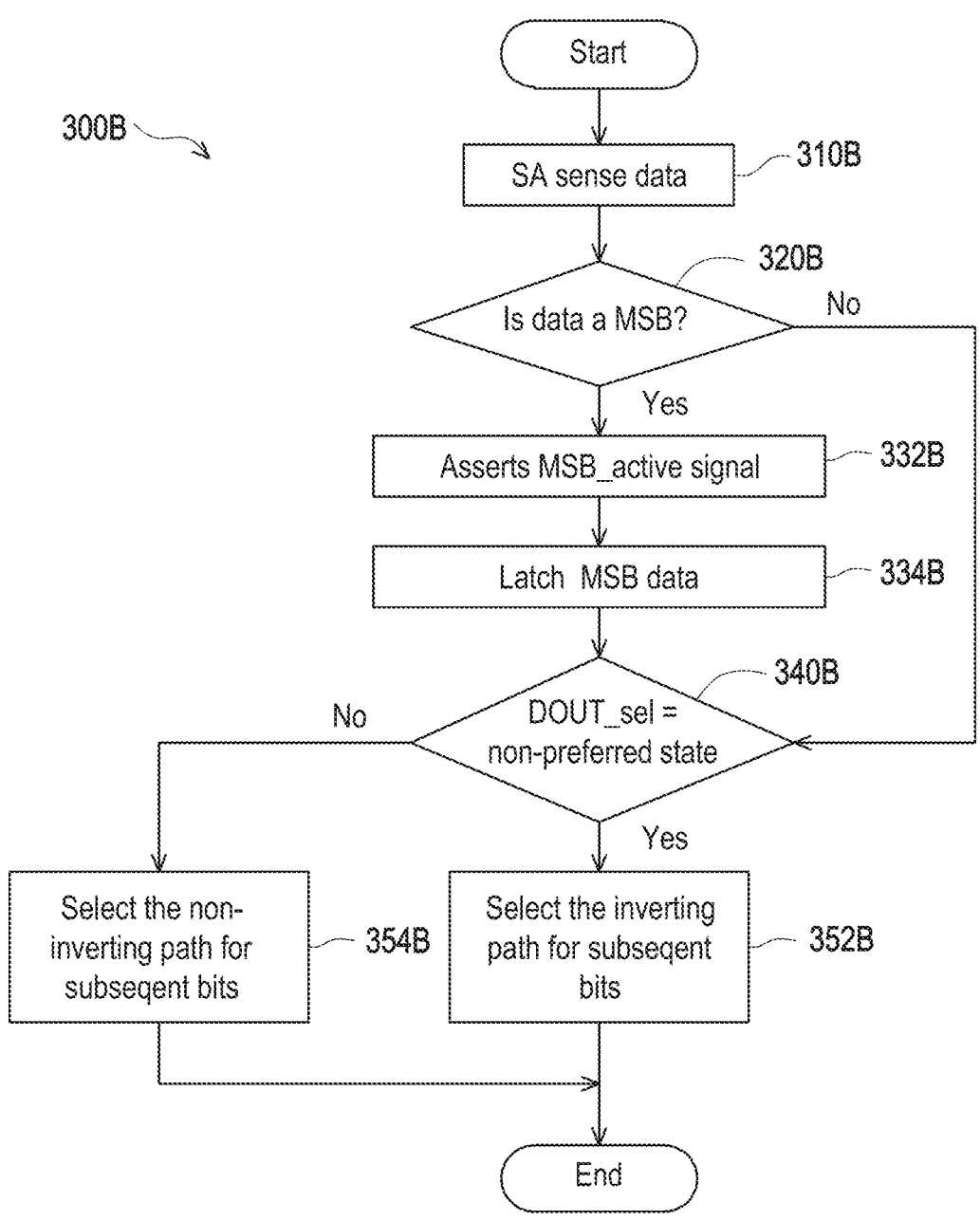

FIG. 4 is a flowchart of a method 300B of reading the stored bits in the memory storage 110 of FIGS. 1A-1B, in accordance with some embodiments. The method 300B is a specific example of the method 300 in FIG. 3 when the MSB in an input data is used as the bit-state indicator to predict whether the binary one or the binary zero is the majority bit value. In operation 310B of method 300B, data is sensed with a sense amplifier. In operation 320B of method 300B, a bit is read from a bit cell in the memory storage 110. If the bit sensed is not the MSB bit, the process proceeds to operation 340B. Conversely, if the bit sensed is the MSB bit, the process proceeds to operation 332B and subsequently to operation 334B. In operation 332B of method 300B, an MSB_active signal is asserted. In operation 334B of method 300B, the MSB bit is latched. In operation 340B of method 300B, the signal DOUT_sel related to the latch output signal is applied to the read path switch. In some embodiments, if the signal DOUT_sel indicates that the subsequent bits in the input data need to be inverted, the inverting path for the data bits is selected in operation 352B, and conversely, if the signal DOUT_sel indicates that the subsequent bits in the input data does not need to be inverted, the non-inverting path for the data bits is selected in operation 354B.

Figure 5:
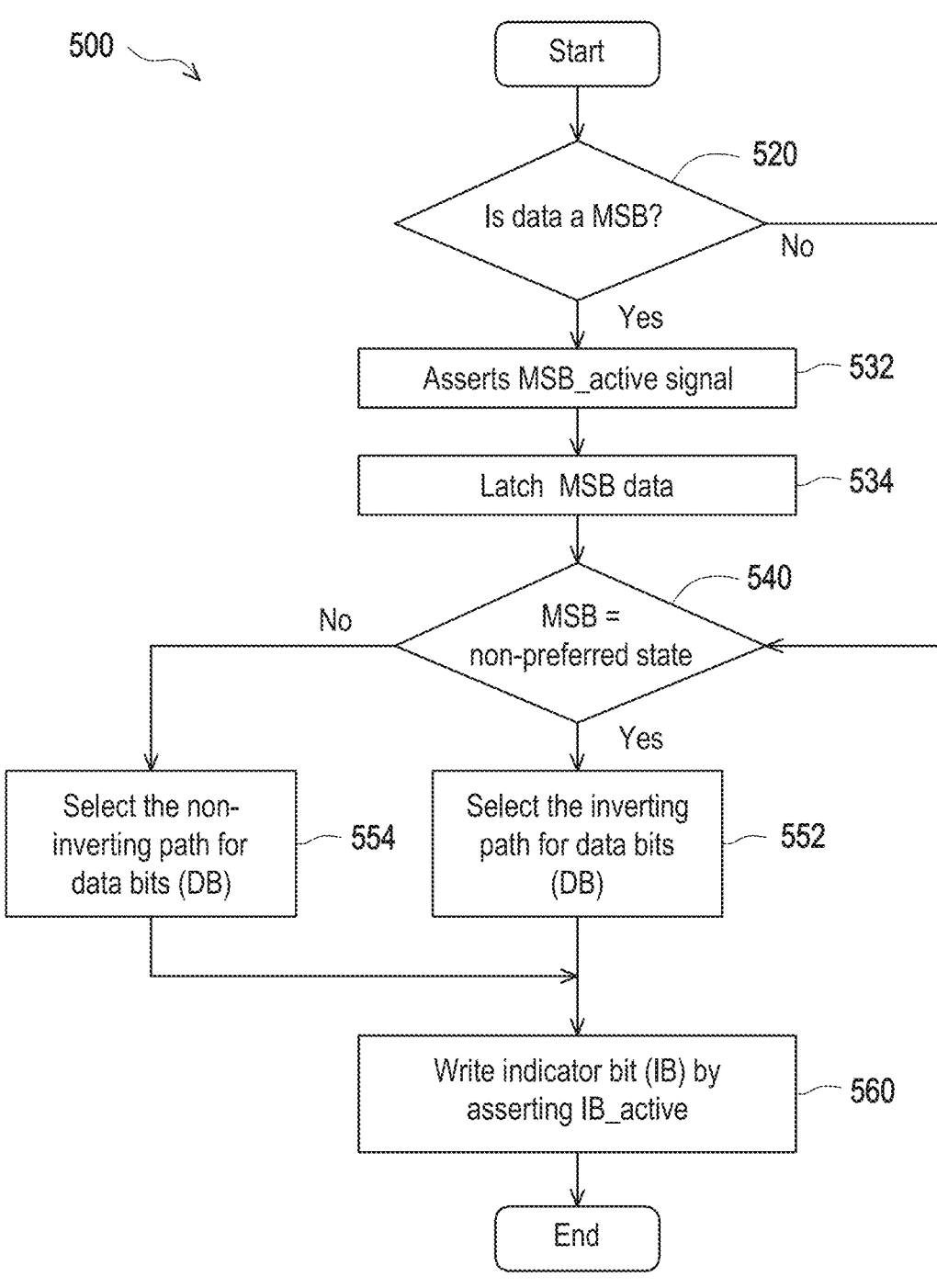
FIG. 5 and FIG. 6 are flowcharts of methods of writing data into the memory storage, in accordance with some embodiments.

FIG. 5 is a flowchart of a method 500 of writing the data into the memory storage 110 of FIGS. 1A-1B as stored bits based on the bit value of the MSB in the input data, in accordance with some embodiments. The sequence in which the operations of method 500 are depicted in FIG. 5 is for illustration only; the operations of method 500 are capable of being executed in sequences that differ from that depicted in FIG. 5. It is understood that additional operations may be performed before, during, and/or after the method 500 depicted in FIG. 5, and that other processes may only be briefly described herein.

In the method 500, operation 520 determines whether an input bit in the input data for writing into the memory storage 110 is the MSB bit. If the input bit is not the MSB bit, the process proceeds to operation 540. Conversely, if the input bit is the MSB bit, the process proceeds to operation 532 and subsequently to operation 534.

After an MSB_active signal is asserted in operation 532, in operation 534 of the method 500, the input bit is latched as the MSB bit. In the example embodiment of FIGS. 1A-1B, the MSB_active signal is applied to the terminal 135 of the bit-state indicator latch 130, and the value of the MSB bit is latched into the bit-state indicator latch 130. After operation 534, the process proceeds to operation 540.

In operation 540 of method 500, if the MSB bit indicates that the majority bit value in the input data would be stored into the non-preferred state should the non-inventing path be selected, the process proceeds to operation 552 and the inverting path for the data bits is selected to write the input bit to a bit cell. On the other hand, if the MSB bit indicates that the minority bit value in the input data would be stored into the non-preferred state should the non-inventing path be selected, the process proceeds to operation 554 and the non-inverting path for the data bits is selected to write the input bit to a bit cell. In the example embodiment of FIGS. 1A-1B, during operation 540, the latched value of the MSB bit at the output terminal 138 of the bit-state indicator latch 130 is compared with the Reliable Bit signal. If the latched value of the MSB bit is not equal to the Reliable Bit signal, the write path 144 is selected. If the latched value of the MSB bit is equal to the Reliable Bit signal, the write path 142 is selected. After operation 552 or operation 554, the process proceeds to operation 560.

In operation 560 of method 500, the indicator bit IB is written to a bit cell by asserting the IB-ACTIVE signal. In the example embodiment of FIGS. 1A-1B, before the IB- ACTIVE signal is asserted, the IB write switch 440 connects a terminal of the write path switch 145 to the input 122 of the write driver 120. When the IB-ACTIVE signal is asserted, the IB write switch 440 connects the output terminal 438 of the reliability checker 430 to the input 122 of the write driver 120 and the indicator bit IB is coupled to the input 122.

Figure 6:
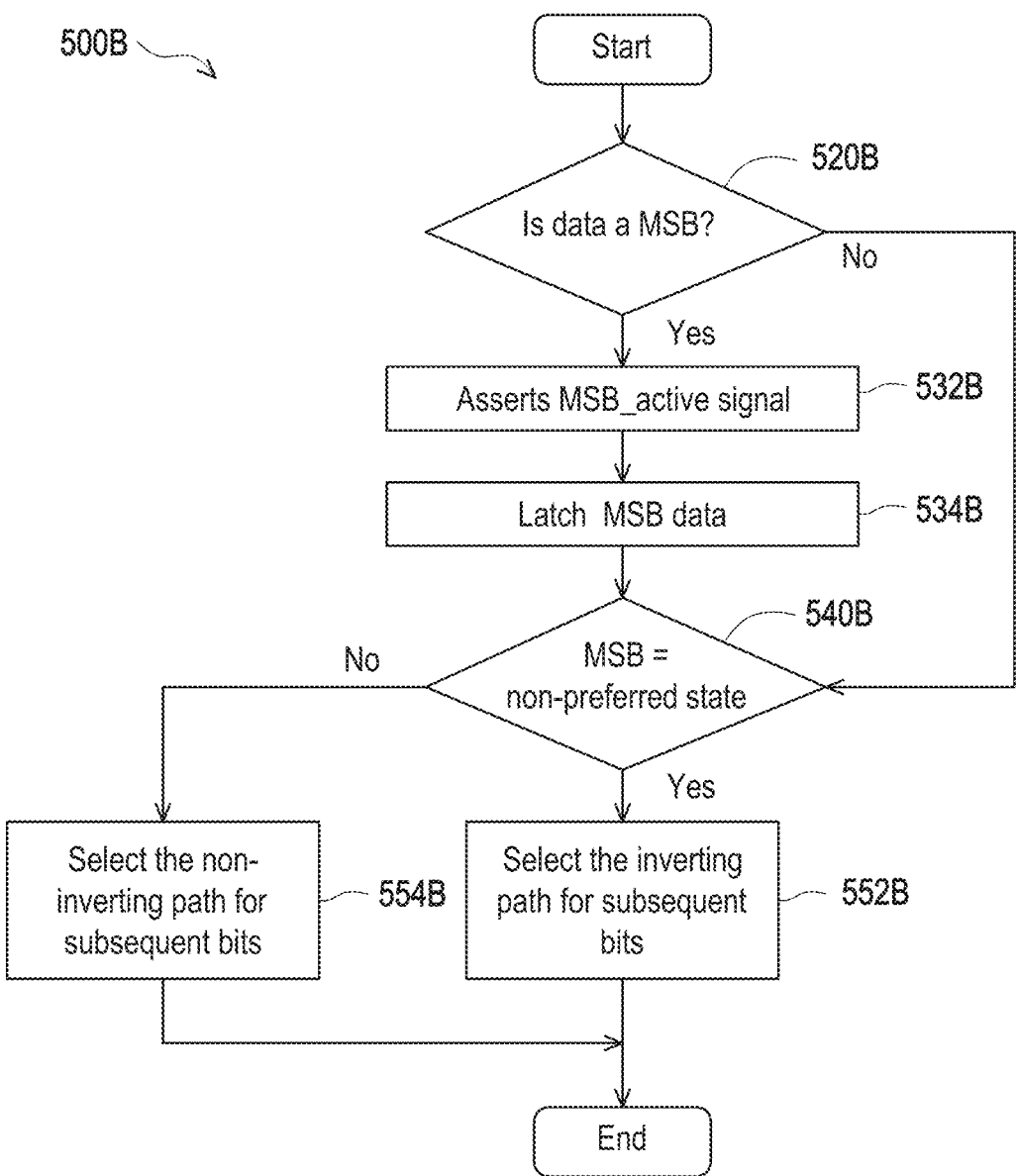

FIG. 6 is a flowchart of a method 500B of writing the data into the memory storage 110 of FIGS. 1A-1B as stored bits based on the bit value of the MSB in the input data, in accordance with some embodiments. When the method 500B is applied to the integrated circuit 100 in FIGS. 1A-1B, the MSB-ACTIVE signal is applied to the terminal 135 of the bit-state indicator latch 130. In the method 500B, operation 520B determines whether an input bit in the input data for writing into the memory storage 110 is the MSB bit. If the input bit is not the MSB bit, the process proceeds to operation 540B. Conversely, if the input bit is the MSB bit, the process proceeds to operation 532B and subsequently to operation 534B. After the MSB-ACTIVE signal is asserted in operation 532B, in operation 534B of the method 500, the input bit is latched as the MSB bit. After operation 534B, the process proceeds to operation 540B. In operation 540B of method 500B, if the MSB bit indicates that the majority bit value in the input data would be stored into the non-preferred state should the non-inventing path be selected, the process proceeds to operation 552B, and the inverting path is selected to write subsequent bits to the bit cells. On the other hand, if the MSB bit indicates that the minority bit value in the input data would be stored into the non-preferred state should the non-inventing path be selected, the process proceeds to operation 554B, and the non-inverting path is selected to write subsequent bits to the bit cells.

Figure 7:
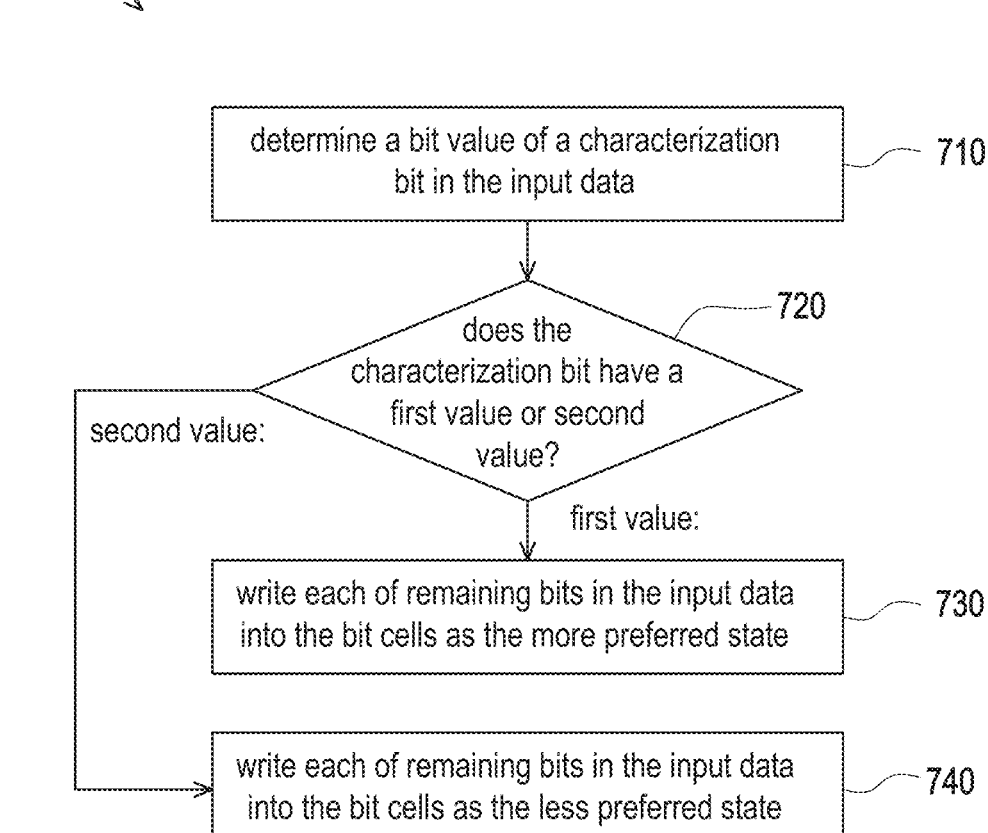
FIG. 7 is a flowchart of a method of storing an input data of a data set into a memory storage having bit cells, in accordance with some embodiments.

FIG. 7 is a flowchart of a method of storing an input data of a data set into a memory storage having bit cells, in accordance with some embodiments. In the memory storage, a bit cell has a preferred state and a non-preferred state, in accordance with some embodiments. The sequence in which the operations of method 700 are depicted in FIG. 7 is for illustration only; the operations of method 700 are capable of being executed in sequences that differ from that depicted in FIG. 7. It is understood that additional operations may be performed before, during, and/or after the method 700 depicted in FIG. 7, and that other processes may only be briefly described herein.

In operation 710 of method 700, the bit value of a characterization bit in the input data is determined. In one example, when the input data is coded in N bits having an index i, with $0 \le i \le N-1$. The bit identified as M[N−1] is the MSB, and the bit identified as M[0] is the LSB. In some embodiments, the characterization bit is identified as M[c], wherein the index c is smaller or equal to N−1. In some embodiments, the index c=N−1, and the characterization bit M[c] is the most significant bit. In some embodiments, the index c=N−2, and the characterization bit M[c] is a bit immediately adjacent to the most significant bit. In some embodiments, the index c<N−2, and the characterization bit M[c] is a bit that is separated from the most significant bit by one or more bits. In some embodiments, a characterization bit is used to determine which of the binary one or the binary zero is the majority bit value. After operation 710, the process proceeds to operation 720.

Operation 720 determines whether the characterization bit have a first value or second value. If the characterization bit has a first value, the process proceeds to operation 730. On the other hand, if the characterization bit has a second value, the process proceeds to operation 740. In some embodiments, the first value of the characterization bit is binary one while the second value of the characterization bit is binary zero. In some embodiments, the first value of the characterization bit is binary zero while the second value of the characterization bit is binary one.

In operation 730 of method 700, each of remaining bits in the input data is written into the bit cells as the preferred state. In operation 740 of method 700, each of remaining bits in the input data is written into the bit cells as the non-preferred state. In some embodiments, the characterization bit is the most significant bit M[N–1] of an N-bits coded input data, the remaining bits are the bits M[i] with 0≤i≤N–2. In the example embodiments as shown in FIGS. 1A-1B, each bit of the data at the write terminal 102 is transmitted to the input 122 of the write driver 120 as an input bit of the input data. In an example implementation of the write driver 120, the binary one in the input data at the input 122 of the write driver 120 is written into a bit cell and stored in the bit cell as the preferred state, while the binary zero in the input data at the input 122 of the write driver 120 is written into a bit cell and stored in the bit cell as the non-preferred state. The write path switch 145 is implemented to connect the write terminal 102 with the input 122 directly through the first write path 142 if the MSB has the value of the binary one, and the write path switch 145 is also implemented to connect the write terminal 102 with the input 122 through the inverter 144INV in the second write path 144 if the MSB has the value of the binary zero. The first write path 142 forms a part of a non-inverting write path, while the second write path 144 forms a part of an inverting write path.

Conditional Probabilities of Finding Binary One in Remaining Bits when MSB is Known In some embodiments, the MSB in an input data is used to predict the bit values of the remaining bits in the input data, when the input data is sampled from a data set that follows a data distribution. Examples of the data set includes the collection of the weights assigned to the nodes in a neural-network. In one non-limiting example, the weight Wk assigned to the node k follows a mass distribution function $f(W_k)$, where 1≤k≤K, and K is the number of the nodes in the neural-network. In some embodiments, each weight $W_k$ is represented by an N-bits integer. The index i for the bit M[i] of each weight $W_k$ ranges from 0 to N–1, and M (N–1) represents the MSB. Because the weight $W_k$ of the node k has a statistical distribution, the bit M[i] also has a statistical distribution.

In some embodiments, the input data (which is sampled from a data set) is characterized by a data distribution. The conditional probability of finding the binary one in a single bit of the input data when the MSB is binary one depends upon the data distribution of the input data. The conditional probability of finding the binary one in a single bit of the input data when the MSB is binary zero also depends upon the data distribution of the input data.

In some embodiments, the conditional probability of finding the binary one in a single bit of the input data is determined based upon a coding table and the data distribution of the data set. As a non-limiting example, a coding table of three bits coded integers in 2's complement representation is shown below as TABLE 1:

TABLE 1

|  | M[2] | M[1] | M[0] |
|---|---|---|---|
| n = –4 | 1 | 0 | 0 |
| n = –3 | 1 | 0 | 1 |

TABLE 1-continued

|  | M[2] | M[1] | M[0] |
|---|---|---|---|
| n = –2 | 1 | 1 | 0 |
| n = –1 | 1 | 1 | 1 |
| n = 0 | 0 | 0 | 0 |
| n = 1 | 0 | 0 | 1 |
| n = 2 | 0 | 1 | 0 |
| n = 3 | 0 | 1 | 1 |

In TABLE 1, each row is a 2's complement representation of one of the integers (ranging from –4 to 3), and the binary values in each row are the binary values of data bits M[2], M[1], and M[0] for the corresponding represented integer. Here, M[2] is the MSB for the corresponding represented integer, and M[0] is the LSB for the corresponding represented integer. For example, for representing the integer n=–2, the bit values of the three bits are shown correspondingly as M[2]=1, M[1]=1, and M[0]=0 in TABLE 1.

Figure 8:
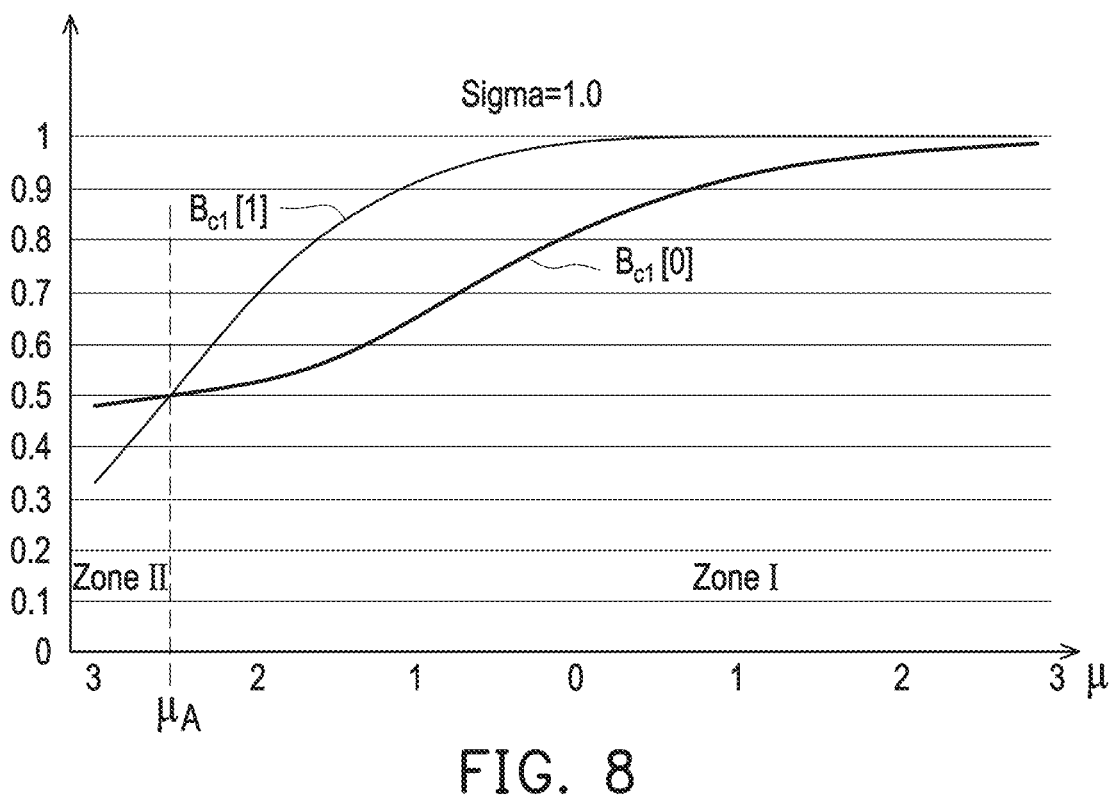
FIG. 8 is a plot diagram of the conditional probabilities of finding the binary one in a single bit of the input data, when the MSB is the binary one, in accordance with some embodiments.

FIG. 8 is a plot diagram of the conditional probabilities of finding the binary one in a single bit of the input data, when the MSB is the binary one, as a function of the mean value μ of the data distribution, in accordance with some embodiments. In some embodiments, the probability of finding the binary one or the binary zero in the input data is correlated with the MSB in the input data. As an example, for an input data coded with the coding table in TABLE 1, the conditional probabilities of finding the binary one in the data bit M[1] and M[0] when the MSB M[2] has the binary one are plotted correspondingly as curves $B_{c1}[1]$ and $B_{c1}[0]$ in FIG. 8 as a function of the mean value μ. The conditional probabilities $B_{c1}[1]$ and $B_{c1}[0]$ of finding the binary one in the data bit M[1] and M[0] when the MSB M[2] has the binary one are calculated with the equations in FIGS. 10A-10D and FIGS. 14A-14B, which are described later. As shown in FIG. 8, when the three-bits integer in the data set follows a normal distribution function that has a mean value u in a range which is identified as the "Zone I", the conditional probabilities $B_{c1}[1]$ and Ber [0] of finding the binary one in the data bit M[1] and M[0] are both larger than 0.5. That is, for integer probability distributions corresponding to the "Zone I" (which corresponds to $\mu > \mu_A$), if the MSB M[2] of the input data has the binary one, then, it is more likely to find the binary one in each of the data bits M[1] and M[0] of the input data.

Figure 9:
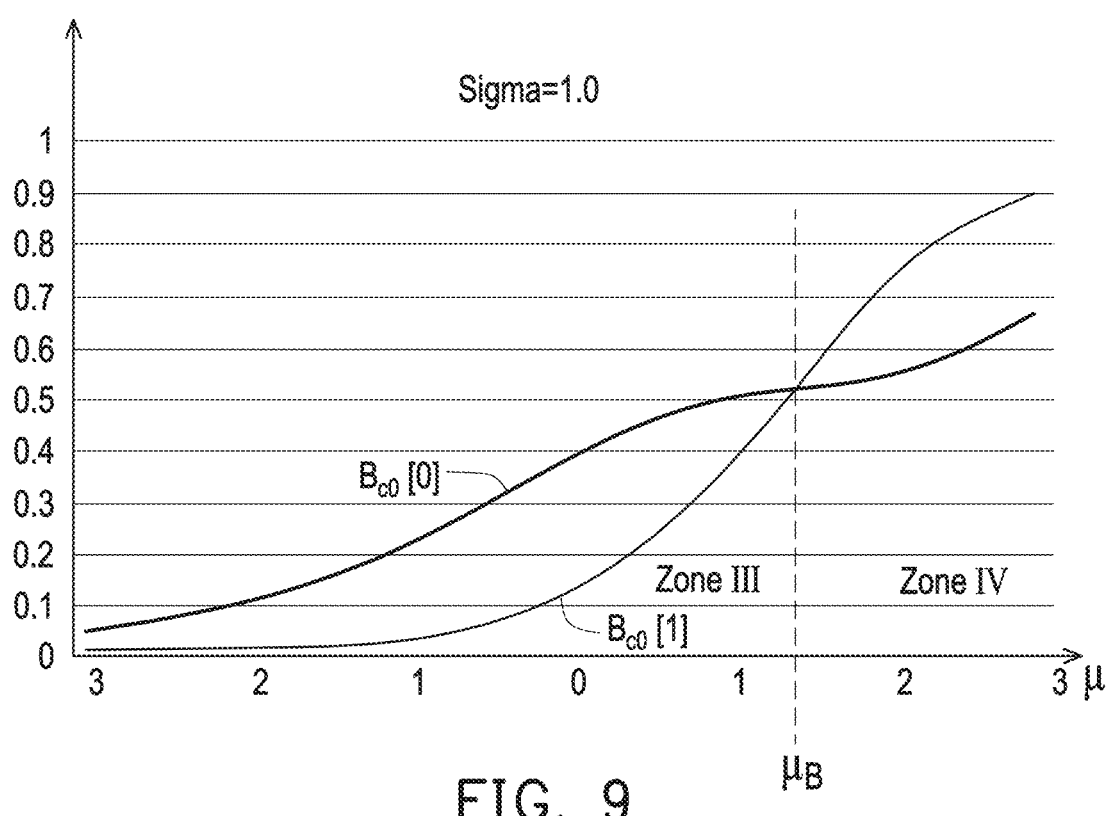
FIG. 9 is a plot diagram of the conditional probabilities of finding the binary one in a single bit of the input data, when the MSB is the binary zero, in accordance with some embodiments.

FIG. 9 is a plot diagram of the conditional probabilities of finding the binary one in a single bit of the input data, when the MSB is the binary zero, as a function of the mean value μ of the data distribution, in accordance with some embodiments. For an input data coded with the coding table in TABLE 1, conditional probabilities of finding the binary one in the data bits M[1] and M[0] when the MSB M[2] has the binary zero are plotted correspondingly as curves $B_{c0}[1]$ and $B_{c0}$ [0] in FIG. 9 as a function of the mean value μ. The conditional probabilities $B_{c0}[1]$ and $B_{c0}$ [0] of finding the binary one in the data bit M[1] and M[0] when the MSB M[2] has the binary zero are calculated with The equations in FIGS. 10A-10D and FIGS. 15A-15B, which are described later. As shown in FIG. 9, when the three-bits integer in the data set follows a normal distribution function that has a mean value μ in a range which is identified as the "Zone III"", the conditional probabilities $B_{c0}[1]$ and Boo [0] of finding the binary one in the data bit M[1] and M[0] are both smaller than 0.5. That is, for integer probability distributions corresponding to the "Zone III" (which corresponds to $\mu < \mu B$), if the MSB M[2] of the input data has the binary zero, then, it is more likely to find the binary zero in each of the data bits M[1] and M[0] of the input data.

Based on the combined results in FIG. 8 and FIG. 9 about the conditional probabilities of finding the binary one in the data bits M[1] and M[0], for integer probability distributions corresponding to the overlap zone between the "Zone I" and the "Zone III," the MSB M[2] determines the majority bit value of the data set. For example, if the data set follows a normal distribution function that has a mean value in the range between $\mu_A$ and $\mu_B$ (i.e., $\mu_A<\mu<\mu_B$). the majority bit value is the binary one when the MSB M[2]=1, and the majority bit value is the binary zero when the MSB M[2]=0. It is advantageous to store the binary one or the binary zero into a bit cell based on the majority bit value of the data. When the MSB M[2]=1, it is advantageous to store the binary one in the preferred state and to store the binary zero in the non-preferred state. On the other hand, when the MSB M[2]=0, it is advantageous to store the binary one in the non-preferred state and to store the binary zero in the preferred state. The bit value of the MSB M[2] is used to predict reliably the majority bit value in a data, when the data follows a normal distribution function that has a mean value in the range between $\mu_A$ and $\mu_B$ (i.e., $\mu_A<\mu<\mu_B$).

Equations for Calculating Probabilities of Finding Binary One Based on Data Distribution In FIGS. 1A-1B, during the writing process when a data at the write terminal 102 is written into the memory storage 110 as a stored data, the bit-state indicator is set based on a majority bit value in the data or based on a minority bit value in the data. In some embodiments, the majority bit value and the minority bit value are determined based on a probability of finding a binary one in the data or based on a probability of finding a binary zero in the data. As each of the binary one and the binary zero is either the majority bit value or the minority bit value, once the majority bit value is determined, the minority bit value is automatically determined, and vice versa. In some embodiments, the data at the write terminal 102 belongs to a data set which has a data distribution that is known, and either the probability of finding the binary one in the data or the probability of finding the binary zero in the data are determined based upon the data distribution of the data set. As the sum of the probability of finding the binary one and the probability of finding the binary zero is equal to one, after the probability of finding the binary one is determined, the probability of finding the binary zero is determined automatically, and vice versa.

In some embodiments, the probability of finding the binary one in the data is determined based upon a coding table and the data distribution of the data set. As an example, a coding table of three bits coded integers in 2's complement representation is shown as TABLE 1.

Figure 10C:
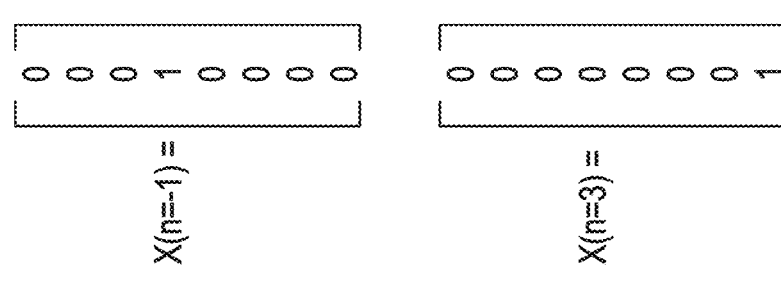
FIG. 10C are equations for defining the possible column vector values of the column vector representing integers, in accordance with some embodiments.
Figure 10C:
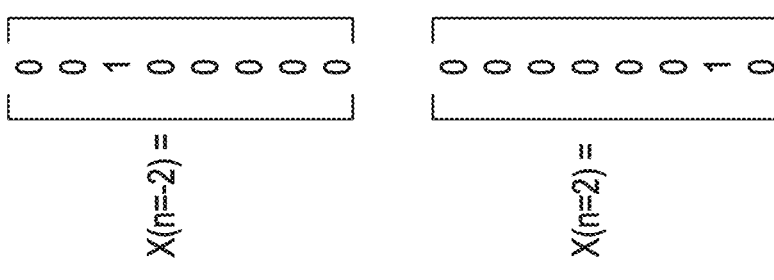
Figure 10C:
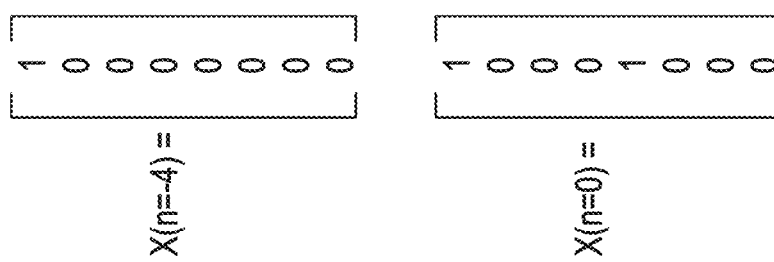

FIG. 10A is an equation of defining a coding matrix corresponding to the coding table in TABLE 1, in accordance with some embodiments. In FIG. 10A, the coding matrix C is an 8×3 matrix. FIG. 10B is an equation of mapping a column vector X to the column vector (M[2], M[1], M[0])$^T$, in accordance with some embodiments. In FIG. 10B, the column vector X represents one of the integers ranging from −4 to 3, and the column vector (M[2], M[1], M[0])$^T$ represents the binary values of the data bits M[2], M[1], and M[0] in the represented integer, based on the 3×8 matrix C$^T$ which is the transpose of the coding matrix C in FIG. 10A. The column vector (M[2], M[1], M[0])$^T$ is the transpose of the row vector (M[2], M[1], M[0]). FIG. 10C are equations for defining the possible column vector values of the column vector X, in accordance with some embodiments. The column vector X can take any one of the column vector values x (n=−4), x (n=−3), x (n=−2), x (n=−1), x (n=0), x (n=1), x (n=2), and x (n=3). When the column vector X is set to be equal to one of the column vector values in FIG. 10C, the equation of FIG. 10B maps an integer (corresponding to the column vector value at the right side of the equation) to the binary values of the data bits M[2], M[1], and M[0] for representing the integer in 2's complement. For example, when the column vector X is equal to x (n=−3), the equation of FIG. 10B maps the column vector (0, 1, 0, 0, 0, 0, 0, 0)$^T$ to the column vector (1, 0, 1)$^T$, which represents that M[2]=1, M[1]=0, and M[0]=1 for the integer−3 in 2's complement.

When a data for writing into the memory storage is randomly selected from a data that has a data distribution, each of the binary value of the data bits for representing the data also has a corresponding random distribution. In the matrix representation of FIGS. 10A-10C, if the column vector X randomly takes one of the column vector values— such as x (n=−4), x (n=−3), x (n=−2), x (n=−1), x (n=0), x (n=1), x (n=2), or x (n=3), then, the column vector (M[2], M[1], M[0])$^T$ takes a corresponding random vector value as determined by the linear equation (M[2], M[1], M[0])$^T$=C$^T$ X. Both the column vector X and the column vector (M[2], M[1], M[0])$^T$ are random variables. The expected value of the column vector (M[2], M[1], M[0])$^T$ is determined by the expected value E(X) of the column vector X. That is, $$(E(M[2]), E(M[1]), E(M[0]))^T = C^T E(X).$$

Each of the expected values E (M[2]), E (M[1]), and E (M[0]) is related to the corresponding mass distribution function of the data bits M[2], M[1], and M[0]. If the probability of finding the binary one in the data bit M[2] is b[2], then, the probability of finding the binary zero in the data bit M[2] is 1-b[2], and the expected value E (M[2]) is given by the equation $$E(M[2]) = b[2]*1 + (1 - b[2])*0 = b[2].$$

Similarly, E (M[1])=b[1], and E (M[0])=b[0], where b[1] is the probability of finding the binary one in the data bit M[1] and b[0] is the probability of finding the binary one in the data bit M[0]. In matrix form, the probability of finding the binary one in the data bits M[2], M[1], and M[0] is given by equation.

$$(b[2], b[1], b[0])^T = C^T E(X).$$

The expected value E(X) is related to the mass distribution function of the column vector X, as expressed by the equation $$E(X) = \Sigma_{i=-4}^{3} p(n = i)*x(n = i),$$

where x (n=i) is the column vector value of the column vector X when integer n=i, and where p(n=i) is the probability of finding integer n=i. In matrix form, the expected value E(X) is given by the equation in FIG. 10D. Thus, the probability of finding the binary one in the data, as expressed as a function of the coding table and the data distribution of the data set, is shown in FIG. 11A. In FIG. 11A, the probability of finding the binary one in the bits M[2], M[1], and M[0] of the coded data are correspondingly equal to b[2], b[1], and b[0]. The probability of finding one of the integers $-4$, $-3$, $-2$, $-1$, 0, 1, 2, and 3 are correspondingly equal to p(n=$-4$), p(n=$-3$), p(n=$-2$), p(n=$-1$), p(n=0), p(n=1), p(n=2), and p(n=3).

In FIG. 11B, the column vector (b[2], b[1], b[0])$^T$ is expressed as a result of the finished matrix multiplication between the transpose coding matrix $C^T$ and the expected value E(X) of the column vector X, as shown in the equation of FIG. 11A. The expected number of binary ones in a three bits coded integer is b[2]+b[1]+b[0], and the probability of finding a binary one in a single bit of the three bits coded integer is (b[2]+b[1]+b[0])/3. After the values of b[2], b[1], and b[0] are substituted with the expressions in FIG. 11B, the probability of finding a binary one, when coded in 2's complement, is given by the equation $$p(\text{binary one}) =$$
$$[1 + p(n = -3) + p(n = -2) + 2p(n = -1) - p(n = 0) + p(n = 3)]/3.$$

In some embodiments, if p (binary one)>0.5, the binary one is the majority bit value and the binary zero is the minority bit value, and conversely, if p (binary one)≤0.5, the binary one is the minority bit value and the binary zero is the majority bit value. In some embodiments, if p (binary one)≥0.5, the binary one is the majority bit value and the binary zero is the minority bit value, and conversely, if p (binary one)<0.5, the binary one is the minority bit value and the binary zero is the majority bit value. Once the majority bit value and the minority bit value are determined, it becomes possible to set the bit-state indicator associated with the data for writing into the memory storage. Based on the bit-state indicator, when the data is written into the memory storage, each bit of the data having a bit value identical to the majority bit value is written into a bit cell in the preferred state, while each bit of the data having a bit value identical to the minority bit value is written into a bit cell in the non-preferred state.

In FIG. 12A, the probability p (binary one) of finding a binary one in a three bits coded integer is expressed as a matrix multiplication involving the 1×3 matrix 13, the transpose coding matrix $C^T$, and the 8×1 matrix $p_8$ (n). The 1×3 matrix $I_3$ is defined in FIG. 12B. The 8×1 matrix $p_8$ (n) is defined in FIG. 12C. Each element in the matrix $p_8$ (n) specifies the probability of finding one of the integers in the data set. For example, the element p(n=i) is the probability of finding integer n=i. In the examples as shown in FIGS. 10A-10D and FIGS. 11A-11B, the probability p (binary one) of finding a binary one in a three bits coded integer is calculated for an example transpose coding matrix $C^T$ representing 2's complement encoding. The equation for calculating the probability p (binary one) in FIG. 12A is not only valid for the transpose coding matrix $C^T$ representing 2's complement encoding but also valid for the transpose coding matrix $C^T$ representing other data encoding scheme. Like the transpose coding matrix $C^T$ representing 2's complement encoding which is determined by the coding table in TABLE 1, in some embodiments, the transpose coding matrix $C^T$ representing another data encoding scheme is also determined by a coding table for the corresponding data encoding scheme. Examples of other data encoding schemes include 1's complement encoding and Gray code encoding While the equations in FIGS. 12A-12C are applicable for calculating the probability p (binary one) of finding a binary one in a three bits coded integer, the equations in FIGS. 13A-13C are applicable for calculating the probability p (binary one) of finding a binary one in a N bits coded data. Examples of the N bits coded data include an N bits coded integer, an N bits coded float number, and also other kinds of data. The equations in FIGS. 13A-13C are the generalization of the equations in FIGS. 12A-12C. In FIG. 13A, the probability p (binary one) of finding a binary one in a N bits coded data is expressed as a matrix multiplication involving the 1×N matrix $I_N$, the transpose coding matrix $C^T$, and the M×1 matrix $p_M$ (u). Here M is the total number of the data in the data set. The 1×N matrix $I_N$ is defined in FIG. 13B. The M×1 matrix $p_M$ (u) is defined in FIG. 13C. Each element in the matrix $p_M$(u) specifies the probability of finding one of the data in the data set. For example, the element $p_M$(u=$u_i$) is the probability of finding data $u_i$ in the data set. The equations in FIGS. 12A-12C are special cases of the equations in FIGS. 13A-13C, when the value of N is taken to be 3 and the value of M is taken to be 8=$2^3$. Similar to the transpose coding matrix $C^T$ in the equation of FIG. 12A, the data encoding scheme represented by the transpose coding matrix $C^T$ in the equation of FIG. 13A is not limit to 2's complement encoding. Other data encoding schemes represented by the transpose coding matrix $C^T$ for using with the equation of FIG. 13A are within the contemplated scope of the present disclosure.

Equations for Calculating Probabilities of Finding Binary One in Remaining Bits when Msb is Known FIGS. 11A-11B are equations for calculating the probabilities of finding the binary one in each data bit of a three-bits integer, in accordance with some embodiments. In FIG. 11A, the probability of finding the binary one in the bits M[2], M[1], and M[0] of the coded data are correspondingly equal to b[2], b[1], and b[0]. The probability of finding one of the integers $-4$, $-3$, $-2$, $-1$, 0, 1, 2, and 3 are correspondingly equal to p(n=$-4$), p(n=$-3$), p(n=$-2$), p(n=$-1$), p(n=0), p(n=1), p(n=2), and p(n=3). In FIG. 11B, the column vector (b[2], b[1], b[0])$^T$ is expressed as a result of the finished matrix multiplication between the transpose coding matrix $C^T$ and the expected value E(X) of the column vector X, as shown in the equation of FIG. 11A.

FIGS. 14A-14B are equations for calculating the conditional probabilities of finding the binary one as a function of the mean value μ when the MSB has the binary one, in accordance with some embodiments. In FIGS. 11A-11B, for each integer i having a value in the range from 0 to 2, the probability b[i] of finding the binary one in the data bit M[i] is related to the expected value E(X) of the column vector X. Similarly, the conditional probability $B_{c1}$[i] of finding the binary one in the data bit M[i] when the characterization bit M[c]=1 is related to the conditional expected value E(X; M[c]=1) of the column vector X, wherein the integer c is the index of the characterization bit. As an example, for the three bits coded integers in the coding table of TABLE 1, if the MSB is selected as the characterization bit, the integer c=2. Because the column vector X and the column vector (M[2], M[1], M[0])$^T$ are related by the linear equation (M[2], M[1], M[0])$^T$=$C^T$ X. The conditional expected value of the column vector ($E_{c1}$(M[2]), $E_{c1}$(M[1]), $E_{c1}$(M[0]))$^T$ when M[c]=1 is determined by the conditional expected value E(X) of the column vector X. That is, $$(E_{c1}(M[2]), E_{c1}(M[1]), E_{c1}(M[0]))^T = C^T E(X; M[c] = 1).$$

For $0 \leq i \leq 2$, the conditional expected value $E_{c1}(M[i])=E(M[i]; M[c]=1)$ is equal to $B_{c1}[i]+1+(1-B_{c1}[i])*0=B_{c1}[i]$, where $B_{c1}[i]$ is the probability of finding the binary one in the data bit $M[i]$ when $M[c]=1$. In matrix form, the probabilities of finding the binary one in the data bits $M[2]$, $M[1]$, and $M[0]$ when $M[c]=1$ are given by equation:

$$(B_{c1}[2], B_{c1}[1], B_{c1}[0])^T = C^T E(X; M[c] = 1).$$

The conditional expected value $E(X; M[c]=1)$ is related to the conditional mass distribution function of the column vector X, as expressed by the equation $$E(X; M[c] = 1) = \sum_{i=-4}^{3} p(n = i; M[c] = 1) * x(n = i).$$

where x $(n=i)$ is the column vector value of the column vector X for integer $n=i$, and where $p(n=i; M[c]=1)$ is the conditional probability of finding integer $n=i$ when $M[c]=1$. If the value of the bit $M[c]$ in the coded data for the integer $n=i$ is equal to zero, then, $p(n=i; M[c]=1)=0$. On the other hand, if the value of the bit $M[c]$ in the coded data for the integer $n=i$ is equal to one, then, $p(n=i; M[c]=1)=K_1 \cdot p(n=i)$. Here, the proportional constant $K_1$ is determined by the normalization condition $$\sum_{i=-4}^{3} p(n = i; M[c] = 1) = 1.$$

As an example, for the three bits coded integers in the coding table of TABLE 1, when the MSB is selected as the characterization bit (i.e., the integer $c=2$), $p(n=i; M[2]=1)=0$ for $0 \leq n \leq 3$, and $p(n=i; M[2]=1)=p(n=i)$ for $-4 \leq n \leq -1$. The column vector $(B_{c1}[2], B_{c1}[1], B_{c1}[0])^T$ is expressed as a matrix multiplication between the transpose coding matrix $C^T$ and the column vector $(p(n=-4), p(n=-3), p(n=-2), p(n=-1), 0, 0, 0, 0)^T$, as shown in the equation of FIGS. 14A-14B. Because $B_{c1}[2]=1$, therefore, $K_1=1/[p(n=-4)+p(n=-3)+p(n=-2)+p(n=-1)]$. The conditional probability $B_{c1}[1]$ and $B_{c1}[0]$ are correspondingly given by the equations $B_{c1}[1]=K_1$ $(p(n=-2)+p(n=-1))$ and $B_{c1}[0]=K_1$. $(p(n=-3)+p(n=-1))$.

Based on similar analysis, the conditional probability $B_{c0}$ [i] of finding the binary one in the data bit $M[i]$ when the characterization bit $M[c]=0$ is related to the conditional expected value $E(X; M[c]=0)$ of the column vector X, wherein the integer c is the index of the characterization bit. As an example, for the three bits coded integers in the coding table of TABLE 1, if the MSB is selected as the characterization bit, the integer $c=2$. Because the column vector X and the column vector $(M[2], M[1], M[0])^T$ are related by the linear equation $(M[2], M[1], M[0])^T=C^T$ X. The conditional expected value of the column vector $(Ec_0 (M [2]), E_{c0} (M[1]), E_{c0}(M[0]))^T$ when $M[c]=0$ is determined by the conditional expected value $E(X)$ of the column vector X. That is, $$(E_{c0}(M[2]), E_{c0}(M[1]), E_{c0}(M[0]))^T = C^T E(X; M[c] = 0).$$

For $0 \leq i \leq 2$, the conditional expected value $E_{c0}(M[i])=E(M[i]; M[c]=0)$ is equal to $B_{c0}$ [i]*1+ $(1-B_{c0}$ [i])*0=$B_{c0}$ [i], where $B_{c0}$ [i] is the probability of finding the binary one in the data bit $M[i]$ when $M[c]=0$. In matrix form, the probability of finding the binary one in the data bits $M[2]$, $M[1]$, and $M[0]$ when $M[c]=0$ is given by equation:

$$(B_{c0}[2], B_{c0}[1], B_{c0}[0])^T = C^T E(X; M[c] = 0).$$

The conditional expected value $E(X; M[c]=0)$ is related to the conditional mass distribution function of the column vector X, as expressed by the equation $$E(X; M[c] = 0) = \sum_{i=-4}^{3} p(n = i; M[c] = 0) * x(n = i).$$

where x $(n=i)$ is the column vector value of the column vector X for integer $n=i$, and where $p(n=i; M[c]=0)$ is the conditional probability of finding integer $n=i$ when $M[c]=0$. If the bit $M[c]$ in the coded data for the integer $n=i$ is equal to zero, then, $p(n=i; M[c]=0)=K_0 \cdot p(n=i)$. On the other hand, if the bit $M[c]$ in the coded data for the integer $n=i$ is equal to one, then, $p(n=i; M[c]=0)=0$. Here, the proportional constant $K_0$ is determined by the normalization condition $$\sum_{i=-4}^{3} p(n = i; M[c] = 0) = 1.$$

FIGS. 15A-15B are equations for calculating the probabilities of finding the binary one as a function of the mean value μ when the MSB has the binary zero, in accordance with some embodiments. As an example, for the three bits coded integers in the coding table of TABLE 1, when the MSB is selected as the characterization bit (i.e., the integer $c=2$), $p(n=i; M[2]=0)=0$ for $-4 \leq n \leq -1$, and $p(n=i; M[2]=0)=p(n=i)$ for $0 \leq n \leq 3$. The column vector $(B_{c0}$ [2], $B_{c0}[1]$, $B_{c0}$ [0])$^T$ is expressed as a matrix multiplication between a modified transpose coding matrix and the column vector $(0, 0, 0, 0, p(n=0), p(n=1), p(n=2), p(n=3))^T$, as shown in the equation of FIGS. 15A-15B. The modified transpose coding matrix in FIG. 13A is modified from the transpose coding matrix $C^T$ by exchanging the binary one and binary zero in the first row of the transpose coding matrix $C^T$. Because $B_{c0}$ [2]=1, therefore, $K_0=1/[p(n=0)+p(n=1)+p(n=2)+p(n=3)]$. The conditional probability $B_{c0}[1]$ and $B_{c0}$ [0] are correspondingly given by the equations $B_{c0}[1]=K_0 \cdot (p(n=2)+p(n=3))$ and $B_{c0}$ [0]=$K_0 \cdot (p(n=1)+p(n=3))$.

In one non-limiting example, the probability $p(n=i)$ of finding integer $n=i$ is modeled based on an accumulative distribution function F (u) associated with a normal distribution function $$f(u) = \left(\frac{1}{\sqrt{2\pi}\,\sigma}\right) \exp\left[-\frac{(u - \mu)^2}{2\sigma^2}\right]$$

having a mean value μ and standard deviation σ. Specifically, the probability $p(n=i)$ is defined to be proportional to F $(i+0.5)$–F $(i–0.5)$. When the probability $p(n=i)$ is normalized based on equation $\Sigma p(n=i)=1$, the probability $p(n=i)$ is defined by the equation $p(n=i)=[F (i+0.5)–F (i–0.5)]/\Sigma[F(i+0.5)–F (i–0.5)]$. For the normal distribution function having the standard deviation $\sigma=1$, the conditional probabilities of finding the binary one in the data bit M[1] and M[0] when the MSB M[2]=1 are calculated and plotted correspondingly as curves $B_{c1}[1]$ and $B_{c1}[0]$ in FIG. 8 as a function of the mean value $\mu$. For the normal distribution function having the standard deviation $\sigma=1$, the conditional probabilities of finding the binary one in the data bit M[1] and M[0] when the MSB M[2]=0 are calculated and plotted correspondingly as curves $B_{c0}[1]$ and $B_{c0}$ [0] in FIG. 9 as a function of the mean value $\mu$.

An aspect of the present disclosure relates to a method of storing an input data of a data set into a memory storage having bit cells in which a bit cell has a first state and a second state. The method includes determining a bit value of a characterization bit in the input data, writing each of remaining bits in the input data into one of the bit cells as the first state if the characterization bit has a first value, and writing each of remaining bits in the input data into the bit cells as the second state if the characterization bit has a second value that is complement to the first value. The remaining bits include all bits in the input data except the characterization bit. In the method, either reading the bit cell with the first state consumes less energy than reading the bit cell with the second state or the bit cell with the first state has less retention errors than the bit cell with the second state.

Another aspect of the present disclosure relates to a method of storing an input data of a data set into a memory storage having bit cells. The method includes determining a bit value of a characterization bit in the input data; writing each of remaining bits in the input data into one of the bit cells either as the first state or as the second state conditioning upon whether the bit value of the characterization bit is a first value or a second value, where the remaining bits include all bits in the input data except the characterization bit, and where the first value and the second value of the characterization bit are complemented to each other. The method also includes where either reading the bit cell with the first state consumes less energy than reading the bit cell with the second state or the bit cell with the first state has less retention errors than the bit cell with the second state.

Another aspect of the present disclosure relates to an integrated circuit. The integrated circuit includes a memory storage having bit cells, where a bit cell has a first state and a second state, where either the memory storage is configured to cause the bit cell with the first state being read out with less energy than the bit cell with the second state or configured to cause the bit cell with the first state having less retention errors than the bit cell with the second state. The circuit also includes a write path switch configured to have a connection state determined by a characterization bit. The circuit also includes a read path switch configured to have a connection state determined by the characterization bit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of storing an input data of a data set into a memory storage having bit cells, wherein a bit cell has a first state and a second state, the method comprising:
   determining a bit value of a characterization bit in the input data;
   writing each of remaining bits in the input data into one of the bit cells as the first state in response to the characterization bit having a first value, wherein the remaining bits include all bits in the input data except the characterization bit; and
   writing each of remaining bits in the input data into the bit cells as the second state in response to the characterization bit having a second value that is a complement to the first value,
   wherein either reading the bit cell with the first state consumes less energy than reading the bit cell with the second state or the bit cell with the first state has less retention errors than the bit cell with the second state.

2. The method of claim 1, wherein the characterization bit is a most significant bit.

3. The method of claim 1, wherein the characterization bit is a bit immediately adjacent to a most significant bit.

4. The method of claim 1, wherein the characterization bit is a bit that is separated from a most significant bit by one or more bits.

5. The method of claim 1, wherein the memory storage is configured to store a binary one in the first state, wherein the input data is an integer coded in 2's complement representation, further comprising:
   writing each of remaining bits in the input data into the bit cells as the first state if a most significant bit in the input data is the binary one; and
   writing each of remaining bits in the input data into the bit cells as the second state if the most significant bit in the input data is the binary zero.

6. The method of claim 1, wherein the memory storage is configured to store a binary zero in the first state, wherein the input data is an integer coded in 2's complement representation, further comprising:
   writing each of remaining bits in the input data into the bit cells as the first state if a most significant bit in the input data is the binary zero; and
   writing each of remaining bits in the input data into the bit cells as the second state if the most significant bit in the input data is the binary one.

7. The method of claim 1, further comprising:
   writing each of remaining bits in the input data into the bit cells through a first write path if the characterization bit has a first value; and
   writing each of remaining bits in the input data into the bit cells through a second write path if the characterization bit has a second value that is complement to the first value.

8. The method of claim 1, wherein the input data is stored into the memory storage through a write driver, further comprising:
   transmitting each of remaining bits in the input data to an input of the write driver through a non-inverting write path if the characterization bit has a first value; and
   transmitting each of remaining bits in the input data to the input of the write driver through an inverting write path if the characterization bit has a second value that is complement to the first value.

9. A method of storing an input data of a data set into a memory storage having bit cells, wherein a bit cell has a first state and a second state, the method comprising:

determining a bit value of a characterization bit in the input data; and writing each of remaining bits in the input data into one of the bit cells either as the first state or as the second state conditioning upon whether the bit value of the characterization bit is a first value or a second value, wherein the remaining bits include all bits in the input data except the characterization bit, and wherein the first value and the second value of the characterization bit are complemented to each other, wherein either reading the bit cell with the first state consumes less energy than reading the bit cell with the second state or the bit cell with the first state has less retention errors than the bit cell with the second state.

10. The method of claim 9, wherein the memory storage is configured to store a binary one in the first state, further comprising:

writing each of remaining bits in the input data into the bit cells as the first state in response to a condition that the bit value of the characterization bit in the input data is the binary one; and writing each of remaining bits in the input data into the bit cells as the second state in response to a condition that the bit value of the characterization bit in the input data is the binary zero.

11. The method of claim 9, wherein the memory storage is configured to store a binary zero in the first state, further comprising:

writing each of remaining bits in the input data into the bit cells as the first state in response to a condition that the bit value of the characterization bit in the input data is the binary zero; and writing each of remaining bits in the input data into the bit cells as the second state in response to a condition that the bit value of the characterization bit in the input data is the binary one.

12. The method of claim 9, further comprising:

writing each of remaining bits in the input data into the bit cells through a first write path in response to a condition that the bit value of the characterization bit has the first value; and writing each of remaining bits in the input data into the bit cells through a second write path in response to a condition that the bit value of the characterization bit has the second value.

13. The method of claim 9, wherein the input data is stored into the memory storage through a write driver, further comprising:

transmitting each of remaining bits in the input data to an input of the write driver through a non-inverting write path in response to a condition that the bit value of the characterization bit has the first value; and transmitting each of remaining bits in the input data to the input of the write driver through an inverting write path in response to a condition that the bit value of the characterization bit has the second value.

14. A method of storing an input data of a data set into a memory storage having bit cells, wherein a bit cell has a first state and a second state, the method comprising:

determining a bit value of a characterization bit in the input data;

writing each of remaining bits in the input data into one of the bit cells as the first state through a first write path in response to the characterization bit having a first value, wherein the remaining bits include all bits in the input data except the characterization bit; and writing each of remaining bits in the input data into the bit cells as the second state through a second write path in response to the characterization bit having a second value that is a complement to the first value, wherein either reading the bit cell with the first state consumes less energy than reading the bit cell with the second state or the bit cell with the first state has less retention errors than the bit cell with the second state.

15. The method of claim 14, wherein the characterization bit is a most significant bit.

16. The method of claim 14, wherein the characterization bit is a bit immediately adjacent to a most significant bit.

17. The method of claim 14, wherein the characterization bit is a bit that is separated from a most significant bit by one or more bits.

18. The method of claim 14, wherein the memory storage is configured to store a binary one in the first state, wherein the input data is an integer coded in 2's complement representation, further comprising:

writing each of remaining bits in the input data into the bit cells as the first state if a most significant bit in the input data is the binary one; and writing each of remaining bits in the input data into the bit cells as the second state if the most significant bit in the input data is the binary zero.

19. The method of claim 14, wherein the memory storage is configured to store a binary zero in the first state, wherein the input data is an integer coded in 2's complement representation, further comprising:

writing each of remaining bits in the input data into the bit cells as the first state if a most significant bit in the input data is the binary zero; and writing each of remaining bits in the input data into the bit cells as the second state if the most significant bit in the input data is the binary one.

20. The method of claim 14, wherein the input data is stored into the memory storage through a write driver, further comprising:

transmitting each of remaining bits in the input data to an input of the write driver through a non-inverting write path in response to the characterization bit having a first value; and transmitting each of remaining bits in the input data to the input of the write driver through an inverting write path in response to the characterization bit having a second value that is complement to the first value.

* * * * *